US010504440B2

(12) United States Patent
Feng

(10) Patent No.: US 10,504,440 B2
(45) Date of Patent: Dec. 10, 2019

(54) PIXEL CIRCUIT, DRIVING METHOD THEREOF, DISPLAY PANEL AND DISPLAY APPARATUS

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventor: Yuhsiung Feng, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 78 days.

(21) Appl. No.: 15/736,690

(22) PCT Filed: Jul. 6, 2017

(86) PCT No.: PCT/CN2017/091925
§ 371 (c)(1),
(2) Date: Dec. 14, 2017

(87) PCT Pub. No.: WO2018/032899
PCT Pub. Date: Feb. 22, 2018

(65) Prior Publication Data

US 2018/0357962 A1 Dec. 13, 2018

(30) Foreign Application Priority Data

Aug. 18, 2016 (CN) .......................... 2016 1 0685895

(51) Int. Cl.
*G09G 3/3258* (2016.01)
*G09G 3/3233* (2016.01)
(Continued)

(52) U.S. Cl.
CPC ......... *G09G 3/3258* (2013.01); *G09G 3/3233* (2013.01); *H01L 27/124* (2013.01);
(Continued)

(58) Field of Classification Search
CPC .. G09G 3/3258; G09G 3/3233; G09G 3/3291; G09G 3/3266; G09G 2300/0819;
(Continued)

(56) References Cited

U.S. PATENT DOCUMENTS 8,803,770 B2 * 8/2014 Jeong .................. G09G 3/3233 345/76
2010/0013816 A1 1/2010 Kwak
(Continued)

FOREIGN PATENT DOCUMENTS

CN 101630481 A 1/2010
CN 102314829 A 1/2012
(Continued)

OTHER PUBLICATIONS

Office Action received for Chinese Patent Application No. 201610685895.6, dated Mar. 13, 2018, 19 pages (11 pages of English Translation and 8 pages of Office Action).
(Continued)

*Primary Examiner* — Abhishek Sarma
(74) *Attorney, Agent, or Firm* — Womble Bond Dickinson (US) LLP

(57) ABSTRACT

A pixel circuit is disclosed, which includes a light-emitting circuit, a driving circuit, a compensation circuit, and an initialization circuit. The initialization circuit is configured to initialize the driving circuit and the light-emitting circuit with a first voltage in response to a first and third scan signals. The compensation circuit is configured to, in response to a second scan signal, write a data voltage into the driving circuit and perform threshold voltage compensation
(Continued)

on the driving circuit. The driving circuit is configured to generate a current dependent upon the written data voltage in response to a light emission control signal. The light-emitting circuit is configured to be driven to emit light by the generated current. Also disclosed are a display panel, a display apparatus, and a method of driving the pixel circuit.

16 Claims, 5 Drawing Sheets

(51) Int. Cl.
*H01L 27/12* (2006.01)
*H01L 27/32* (2006.01)
*G09G 3/3266* (2016.01)
*G09G 3/3291* (2016.01)

(52) U.S. Cl.
CPC ....... *H01L 27/3276* (2013.01); *G09G 3/3266* (2013.01); *G09G 3/3291* (2013.01); *G09G 2300/0819* (2013.01); *G09G 2300/0842* (2013.01); *G09G 2300/0861* (2013.01); *G09G 2310/0216* (2013.01); *G09G 2310/0251* (2013.01); *G09G 2310/0262* (2013.01); *G09G 2310/0264* (2013.01); *G09G 2320/0233* (2013.01)

(58) Field of Classification Search
CPC ... G09G 2310/0264; G09G 2320/0233; G09G 2310/0216; G09G 2310/0262; G09G 2310/0251; G09G 2300/0861; G09G 2300/0842; H01L 27/124; H01L 27/3276
See application file for complete search history.

(56) References Cited

U.S. PATENT DOCUMENTS

| | | | |
|---|---|---|---|
| 2012/0001893 | A1 | 1/2012 | Jeong et al. |
| 2013/0120342 | A1 | 5/2013 | Wang et al. |
| 2013/0235010 | A1 | 9/2013 | Park |
| 2016/0260377 | A1 | 9/2016 | Hu |
| 2017/0110054 | A1 | 4/2017 | Sun et al. |
| 2017/0110056 | A1 | 4/2017 | Hu |
| 2017/0178569 | A1 | 6/2017 | Hu |

FOREIGN PATENT DOCUMENTS

| | | | |
|---|---|---|---|
| CN | 104269133 | A | 1/2015 |
| CN | 104575377 | A | 4/2015 |
| CN | 204680360 | U | 9/2015 |
| CN | 105096826 | A | 11/2015 |
| CN | 105139805 | A | 12/2015 |
| CN | 105405397 | A | 3/2016 |
| CN | 106067291 | A | 11/2016 |

OTHER PUBLICATIONS

International Search Report received for PCT Patent Application No. PCT/CN2017/091925, dated Sep. 11, 2017, 14 pages (2 pages of English Translation and 12 pages of Original Document).

* cited by examiner

PIXEL CIRCUIT, DRIVING METHOD THEREOF, DISPLAY PANEL AND DISPLAY APPARATUS

CROSS-REFERENCE TO RELATED APPLICATIONS

The present application is the U.S. national phase entry of PCT/CN2017/091925, with an international filing date of Jul. 6, 2017, which claims the benefit of Chinese Patent Application No. 201610685895.6, filed on Aug. 18, 2016, the entire disclosures of which are incorporated herein by reference.

TECHNICAL FIELD

The present disclosure relates to the field of display technology, and in particular, to a pixel circuit, a driving method thereof, a display panel and a display apparatus.

BACKGROUND

There are some problems with the existing organic light-emitting displays. Organic light-emitting diodes (OLEDs) are current-driven devices that require a steady current to control light emission. Driving transistors in each OLED pixel circuit may have different threshold voltages due to e.g. fabrication processes and device aging, resulting in each OLED exhibiting different luminance for the same data signal. This may lead to uneven luminance among different display areas.

SUMMARY

Embodiments of the present disclosure provide a pixel circuit that seeks to mitigate, alleviate or eliminate at least one of the above problems.

According to an aspect of the present disclosure, a pixel circuit is provided which comprises a light-emitting circuit, a driving circuit, a compensation circuit, and an initialization circuit. The initialization circuit is connected to a first voltage terminal, a first scan line, and a third scan line and is configured to initialize the driving circuit and the light-emitting circuit with a first voltage supplied from the first voltage terminal in response to a first scan signal on the first scan line and a third scan signal on the third scan line. The compensation circuit is connected to a second scan line, a data line and a second voltage terminal and is configured to, responsive to a second scan signal on the second scan line, write a data voltage on the data line into the driving circuit and perform threshold voltage compensation on the driving circuit. The driving circuit is connected to the second voltage terminal and a light emission control line and is configured to generate a current dependent on the written data voltage in response to a light emission control signal on the light emission control line. The light-emitting circuit is connected between the driving circuit and the first voltage terminal and is configured to be driven to emit light by the generated current.

In some embodiments, the initialization circuit comprises: a first transistor having a gate connected to the first scan line, a first electrode connected to the first voltage terminal, and a second electrode connected to a first node; and a second transistor having a gate connected to the third scan line, a first electrode connected to the first voltage terminal, and a second electrode connected to a second node.

In some embodiments, the driving circuit comprises: a fifth transistor having a source, a drain, and a gate connected to the second node; a sixth transistor having a gate connected to the light emission control line, a first electrode connected to the second voltage terminal, and a second electrode connected to the source of the fifth transistor; and a seventh transistor having a gate connected to the light emission control line, a first electrode connected to the drain of the fifth transistor, and a second electrode connected to the first node.

In some embodiments, the compensation circuit comprises: a third transistor having a gate connected to the second scan line, a first electrode connected to the drain of the fifth transistor, and a second electrode connected to the second node; a fourth transistor having a gate connected to the second scan line, a first electrode connected to the data line, and a second electrode connected to the source of the fifth transistor; and a capacitor having a first terminal connected to the second voltage terminal and a second terminal connected to the second node.

In some embodiments, the light-emitting circuit comprises an organic light-emitting diode having a first terminal connected to the first node and a second terminal connected to the first voltage terminal.

In some embodiments, the fifth transistor is a P-type transistor, wherein the first terminal of the organic light-emitting diode is an anode, and wherein the second terminal of the organic light-emitting diode is a cathode.

In some embodiments, the fifth transistor is an N-type transistor, wherein the first terminal of the organic light-emitting diode is a cathode, and wherein the second terminal of the organic light-emitting diode is an anode.

In some embodiments, the first scan line and the third scan line are configured to transmit a same signal such that the first scan signal and the third scan signal are identical.

According to another aspect of the present disclosure, a display panel is provided which comprises: a plurality of scan lines arranged in a first direction; a plurality of light emission control lines arranged in the first direction; a plurality of data lines arranged in a second direction intersecting the first direction; and a pixel array comprising a plurality of pixel circuits arranged at intersections of the scanning lines, the light emission control lines and the data lines, each of the pixel circuits being connected to three respective ones of the scanning lines and a respective one of the light emission control lines and comprising a light-emitting circuit, a driving circuit, a compensation circuit, and an initialization circuit. The initialization circuit is connected to the first voltage terminal and first and third ones of the three respective scan lines and is configured to initialize the driving circuit and the light-emitting circuit with a first voltage supplied from the first voltage terminal in response to a first scan signal on the first scan line and a third scan signal on the third scan line. The compensation circuit is connected to a second one of the three respective scan lines, a data line and a second voltage terminal and is configured to, responsive to a second scan signal on the second scan line, write a data voltage on the data line into the driving circuit and perform threshold voltage compensation on the driving circuit. The driving circuit is connected to the second voltage terminal and the respective light emission control line and is configured to generate, responsive to a light-emitting control signal on the respective light emission control line, a current dependent on the written data voltage. The light-emitting circuit is connected between the driving circuit and the first voltage terminal and is configured to be driven to emit light by the generated current.

According to yet another aspect of the present disclosure, a display apparatus is provided which comprises the display panel as described above.

According to still yet another aspect of the present disclosure, a method of driving a pixel circuit is provided. The pixel circuit comprises an initialization circuit connected to a first voltage terminal, a first scan line, and a third scan line, a compensation circuit connected to a second scan line, a data line, and a second voltage terminal, a driving circuit connected to the second voltage terminal and a light emission control line, and a light-emitting circuit connected between the driving circuit and the first voltage terminal. The method comprises: initializing, by the initialization circuit, the driving circuit and the light-emitting circuit with a first voltage supplied from the first voltage terminal in response to a first scan signal on the first scan line and a third scan signal on the third scan line; writing, by the compensation circuit in response to a second scan signal on the second scan line, a data voltage on the data line into the driving circuit and performing threshold voltage compensation on the driving circuit; and supplying, by the driving circuit in response to a light-emitting control signal on the light emission control line, a current dependent on the written data voltage to drive the light-emitting circuit to emit light.

In some embodiments, the initialization circuit comprises a first transistor and a second transistor, the compensation circuit comprises a third transistor, a fourth transistor, and a capacitor, the driving circuit comprises a fifth transistor, a sixth transistor, and a seventh transistor, and the light-emitting circuit comprises an organic light-emitting diode. The initializing the driving circuit and the light-emitting circuit comprises applying the first voltage to a gate of the fifth transistor and both ends of the light-emitting diode through the first and second transistors, respectively. The writing the data voltage into the driving circuit and performing the threshold voltage compensation on the driving circuit comprises writing the data voltage and a threshold voltage of the fifth transistor into a gate of the fifth transistor through the fourth, fifth, and third transistors. The supplying the current to the light-emitting circuit comprises providing a current path through which the current flows, the current path comprising the sixth, fifth and seventh transistors and the organic light-emitting diode connected in series.

In some embodiments, the applying the first voltage to the gate of the fifth transistor and the both ends of the organic light-emitting diode through the first and second transistors respectively comprises turning on the first and second transistors during two consecutive periods of time respectively.

These and other aspects of the present disclosure will be apparent from and elucidated with reference to the embodiment(s) described hereinafter.

BRIEF DESCRIPTION OF THE DRAWINGS

Further details, features, and advantages of the disclosure are disclosed in the following description of exemplary embodiments with reference to the attached drawings, in which.

DETAILED DESCRIPTION

It will be understood that, although the terms first, second, third etc. may be used herein to describe various elements, components and/or sections, these elements, components and/or sections should not be limited by these terms. These terms are only used to distinguish one element, component or section from another. Thus, a first element, component or section discussed below could be termed a second element, component or section without departing from the teachings of the present disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

It will be understood that when an element or layer is referred to as being "connected to" or "coupled to" another element or layer, it can be directly connected or coupled to the other element or layer, or intervening elements may be present. In contrast, when an element is referred to as being "directly connected to" or "directly coupled to" another element, there are no intervening elements present.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Embodiments of the present disclosure will be described in detail below with reference to the accompanying drawings.

Figure 1:
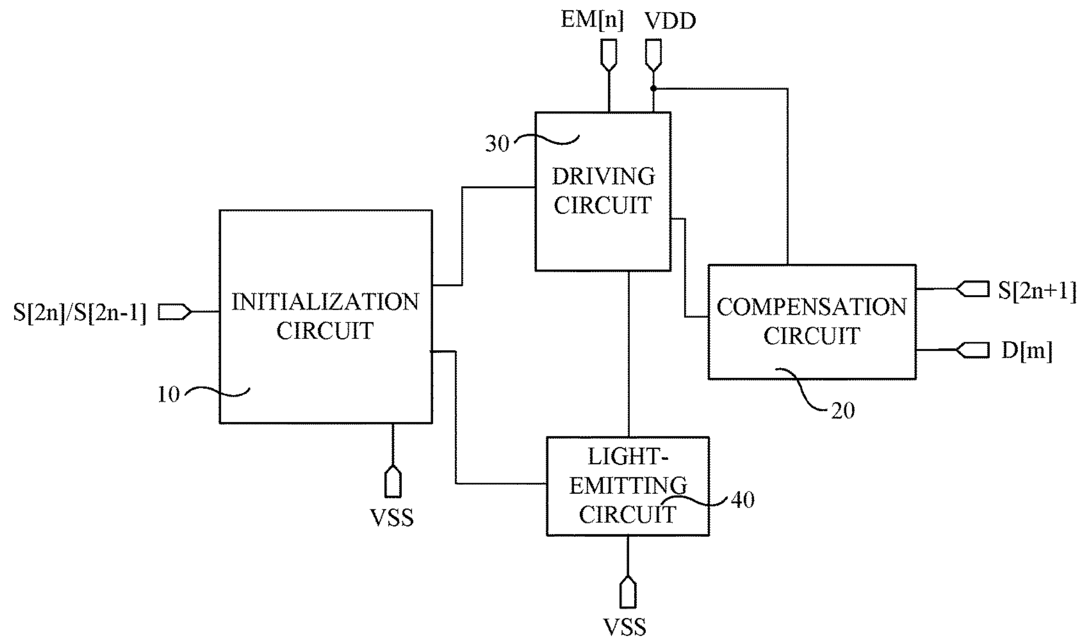
FIG. 1 schematically illustrates a block diagram of a pixel circuit according to an embodiment of the present disclosure.

FIG. 1 schematically illustrates a block diagram of a pixel circuit according to an embodiment of the present disclosure. As shown in FIG. 1, the pixel circuit includes an initialization circuit 10, a compensation circuit 20, a driving circuit 30, and a light-emitting circuit 40.

The initialization circuit 10 is connected to a first voltage terminal VSS, a first scan line S[2*n*], and a third scan line S[2*n*−1]. The initialization circuit 10 is configured to, responsive to a first scan signal on the first scan line S[2*n*] and a third scan signal on the third scan line S[2*n*−1], initialize the driving circuit 30 and the light-emitting circuit 40 with a first voltage supplied from the first voltage terminal VSS.

In this embodiment, the first scan line S[2*n*] and the third scan line S[2*n*−1] are configured to transmit the same signal such that the first scan signal is the same as the third scan signal. Therefore, the first scan line S[2*n*] and the third scan line S[2*n*−1] are shown in FIG. 1 as a single signal terminal indicated by "S[2*n*]/S[2*n*−1]".

The compensation circuit 20 is connected to a second scan line S[2*n*+1], a data line D[m], and a second voltage terminal VDD. The compensation circuit 20 is configured to write a data voltage on the data line D[m] into the driving circuit 30 and perform threshold voltage compensation on the driving circuit 30 in response to a second scan signal on the second scan line S[2*n*+1].

The driving circuit 30 is connected to the second voltage terminal VDD and a light emission control line EM[n]. The driving circuit 30 is configured to generate a current that depends on the written data voltage in response to a light emission control signal on the light emission control line EM[n].

The light-emitting circuit 40 is connected between the driving circuit 30 and the first voltage terminal VSS. The light-emitting circuit 40 is configured to be driven to emit light by the generated current.

As will be described later, by the compensation circuit 20 performing the threshold voltage compensation, the current flowing through the light-emitting circuit 40 may be controlled so that it is independent of the threshold voltage of the driving circuit 30, thereby eliminating an influence of the threshold voltage on the luminance of the light-emitting circuit 40 and, in turn, improving the luminance uniformity of the display.

Figure 2:
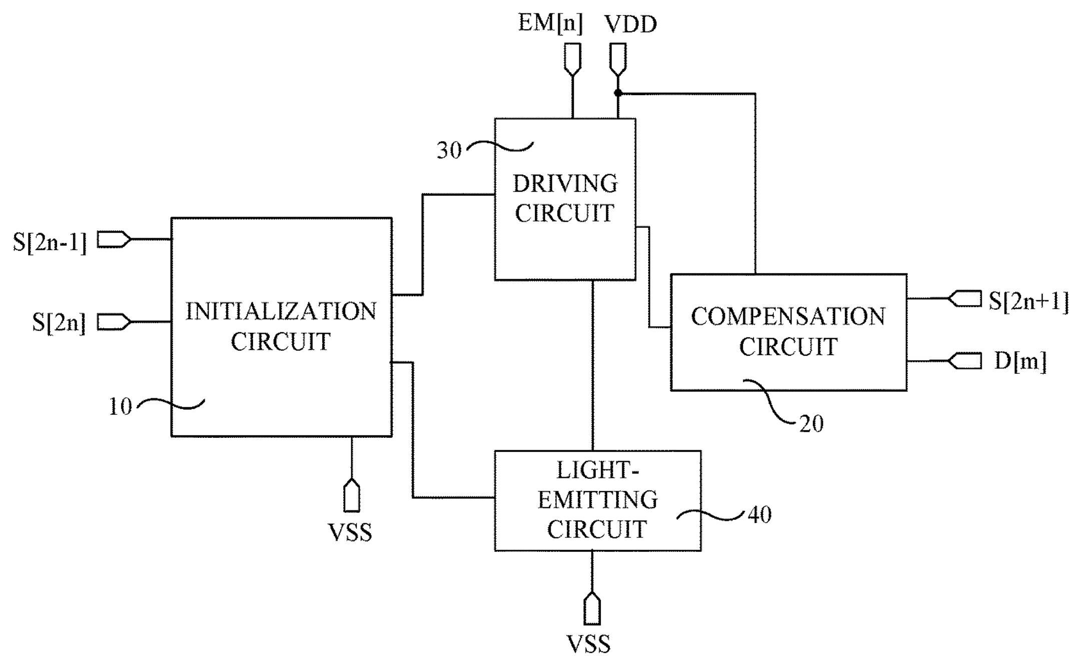
FIG. 2 schematically illustrates a block diagram of a pixel circuit according to an embodiment of the present disclosure.

FIG. 2 schematically illustrates a block diagram of a pixel circuit according to an embodiment of the present disclosure.

This embodiment is different from the embodiment of FIG. 1 in that the first scan line S[2*n*] and the third scan line S[2*n*−1] are shown as separate signal terminals that may transmit different scan signals as will be described later. Alternatively, the separate first and third scan lines S[2*n*] and S[2*n*−1] may also be used to transmit the same scan signal.

Figure 3:
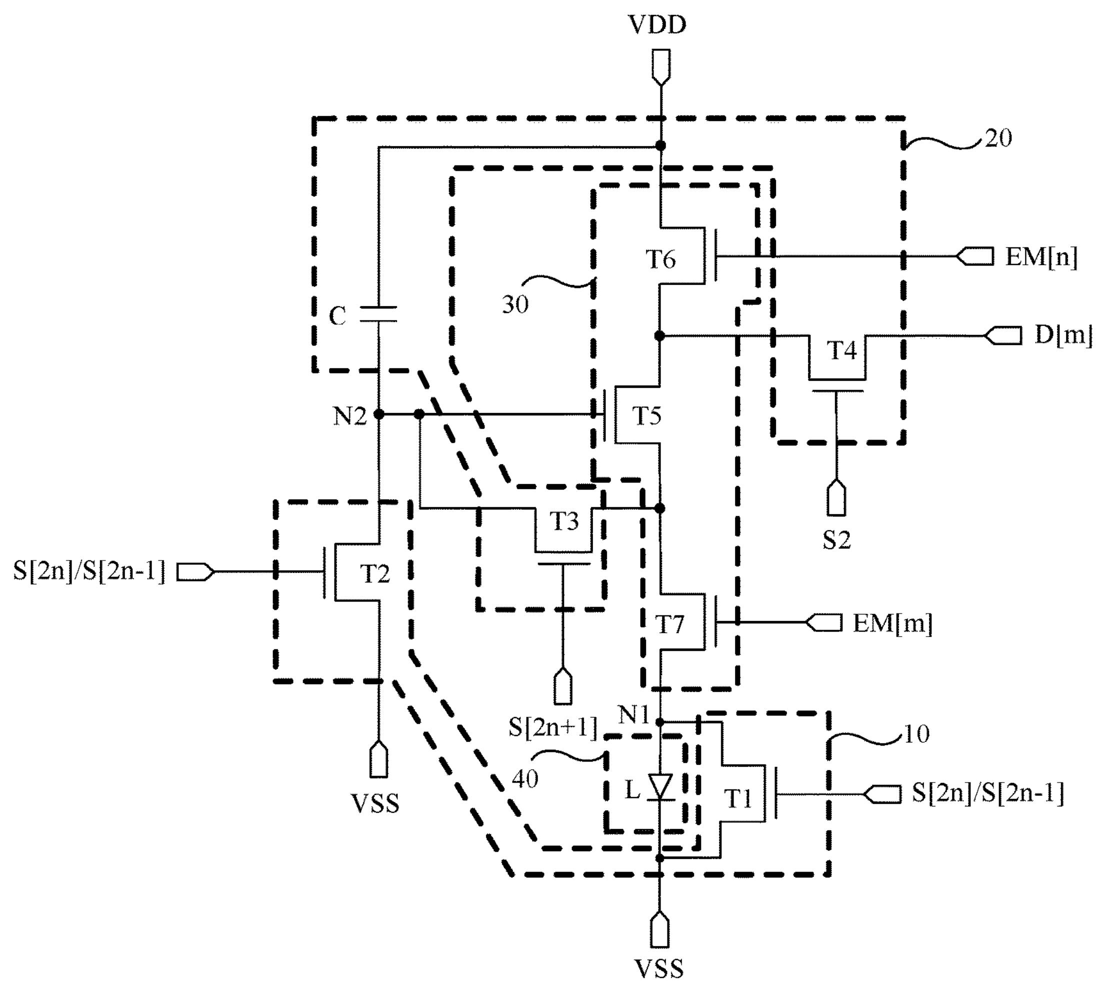
FIG. 3 schematically illustrates a circuit diagram of the pixel circuit of FIG. 1.
Figure 4:
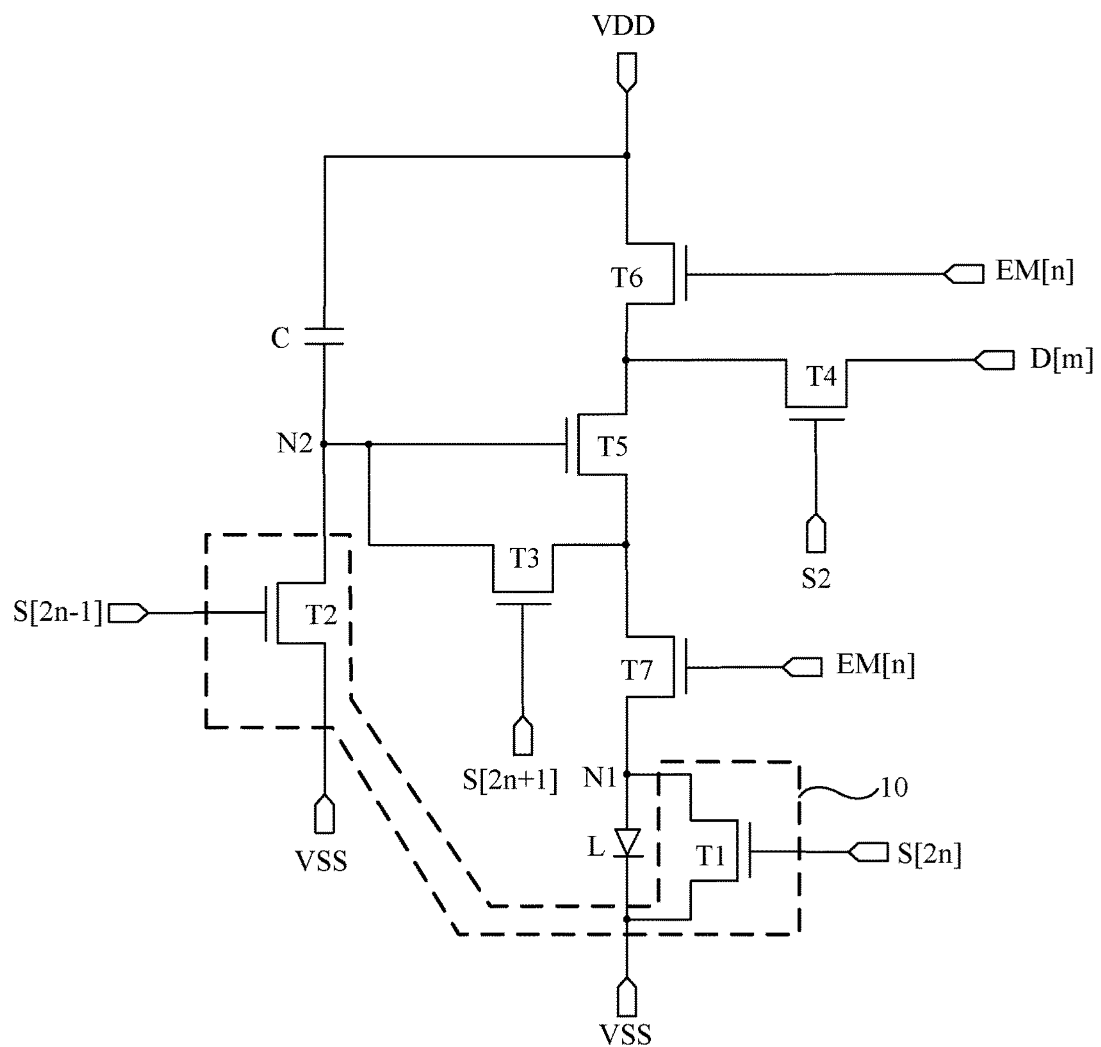
FIG. 4 schematically illustrates a circuit diagram of the pixel circuit of FIG. 2.

FIGS. 3 and 4 schematically illustrate circuit diagrams of the pixel circuits of FIGS. 1 and 2, respectively.

The initialization circuit 10 includes a first transistor T1 and a second transistor T2. The first transistor T1 has a gate connected to the first scan line S[2*n*] (indicated by "S[2*n*]/S[2*n*−1]" in FIG. 3), a first electrode connected to the first voltage terminal VSS, and a second electrode connected to a first node N1. The second transistor T2 has a gate connected to the third scan line S[2*n*−1] (indicated by "S[2*n*]/S[2*n*−1]" in FIG. 3), a first electrode connected to the first voltage terminal VSS, and a second electrode connected to a second node N2.

The driving circuit 30 includes a fifth transistor T5 (which functions as a driving transistor), a sixth transistor T6, and a seventh transistor T7. The fifth transistor T5 has a source, a drain, and a gate connected to the second node N2. The sixth transistor T6 has a gate connected to the light emission control line EM[n], a first electrode connected to the second voltage terminal VDD, and a second electrode connected to the source of the fifth transistor T5. The seventh transistor T7 has a gate connected to the light emission control line EM[n], a first electrode connected to the drain of the fifth transistor T5, and a second electrode connected to the first node N1.

The compensation circuit 20 includes a third transistor T3, a fourth transistor T4 and a capacitor C. The third transistor T3 has a gate connected to the second scan line S[2*n*+1], a first electrode connected to the drain of the fifth transistor T5, and a second electrode connected to the second node N2. The fourth transistor T4 has a gate connected to the second scan line S[2*n*+1], a first electrode connected to the data line D[m], and a second electrode connected to the source of the fifth transistor T5. The capacitor C has a first terminal connected to the second voltage terminal VDD and a second terminal connected to the second node N2.

The light-emitting circuit 40 includes an organic light-emitting diode L having a first terminal connected to the first node N1 and a second terminal connected to the first voltage terminal VSS. In embodiments where the fifth transistor T5 is a P-type transistor, the first terminal of the organic light-emitting diode L is an anode and the second terminal of the organic light-emitting diode L is a cathode. In embodiments where the fifth transistor T5 is an N-type transistor, the first terminal of the organic light-emitting diode L is a cathode and the second terminal of the organic light-emitting diode L is an anode.

In various embodiments, the first, second, third, fourth, sixth, and seventh transistors T1, T2, T3, T4, T6, and T7 function as switching transistors that are typically fabricated such that their first and second electrodes are used interchangeably.

Figure 5:
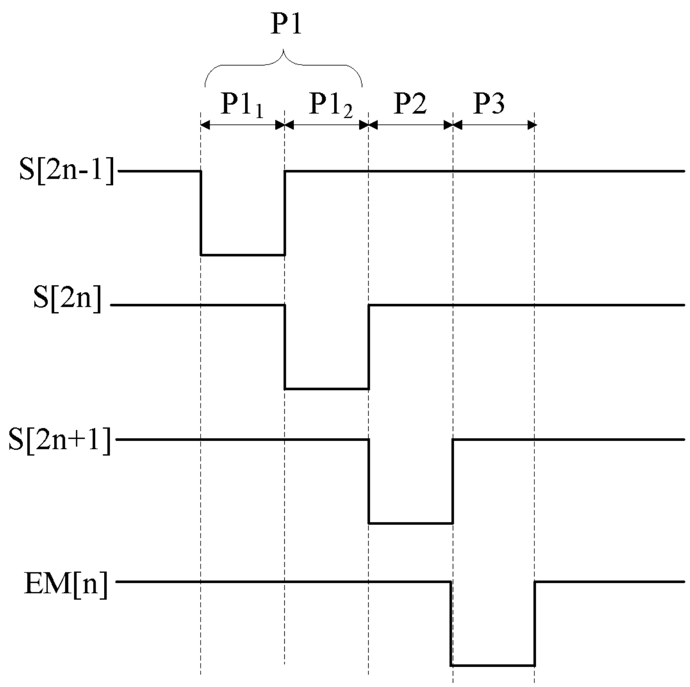
FIG. 5 schematically illustrates a timing diagram for the pixel circuit of FIG. 4.

FIG. 5 schematically illustrates a timing diagram for the pixel circuit of FIG. 4. The operations of the pixel circuit of FIG. 4 will be described in detail below with reference to FIG. 5. It is assumed in the pixel circuit of FIG. 4 that 1) the respective transistors are P-type transistors, 2) the first voltage terminal VSS supplies a low level voltage, and 3) the second voltage terminal VDD supplies a high level voltage. In the following, the low level is represented by "0" and the high level is indicated by "1".

The operations of the pixel circuit include an initialization phase P1, a data write and threshold voltage compensation phase P2, and a light-emitting phase P3.

During the initialization phase P1, the initialization circuit 10 initialize the driving circuit 30 and the light-emitting circuit 40 with a first voltage supplied from the first voltage terminal VSS in response to a first scan signal on the first scan line S[2*n*] and a third scan signal on the third scan line S[2*n*−1]. Specifically, the initialization phase P1 may include a first sub-phase $P1_1$ and a second sub-phase $P1_2$.

In the first sub-phase $P1_1$, S[2*n*]=1, S[2*n*+1]=1, S[2*n*−1]=0 and EM[n]=1. The first transistor T1 is turned on to transmit the low level of the first voltage terminal VSS to the first node N1. At this time, the voltage across the organic light-emitting diode L is zero, so that the light-emitting diode L is initialized so as to remove the influence of the data voltage of the previous image frame.

In the second sub-phase $P1_2$, S[2*n*−1]=1, S[2*n*+1]=1, S[2*n*−1]=0 and EM[n]=1. The second transistor T2 is turned on to transmit the low level of the first voltage terminal VSS to the second node N2 to initialize the gate voltage of the fifth transistor T5, thus removing the influence of the data voltage of the previous image frame.

In the initialization phase P1, only the voltage supplied from the single first voltage terminal VSS is needed to perform the initialization, thereby reducing the amount of power required in the pixel circuit. This facilitates the simplification of the circuit.

During the data write and threshold voltage compensation phase P2, in response to a second scan signal on the second scan line S[2n+1], the compensation circuit 20 writes a data voltage on the data line D[m] into the driving circuit 30 and performs threshold voltage compensation on the driving circuit 30.

Specifically, S[2n]=1, S[2n+1]=0, S[2n−1]=1 and EM[n] =1. The fourth transistor T4 is turned on to transmit the data voltage Vdata on the data line D[m] to the source of the fifth transistor T5. The third transistor T3 is turned on to bring the drain and gate of the fifth transistor T5 into conduction, in which case the fifth transistor T5 operates in a diode mode in which Vds=Vth. Vds is the drain-source voltage of the fifth transistor T5, and Vth is the threshold voltage of the fifth transistor T5. Therefore, the gate voltage Vg of the fifth transistor T5 is Vdata+Vth.

In this phase P2, data writing can be achieved by the fourth, fifth and third transistors T4, T5 and T3 without charging/discharging of large-size capacitors. This allows for a pixel circuit with a reduced footprint and hence an improved pixels per inch (PPI).

During the light-emitting phase P3, the driving circuit 30 supplies a current that is dependent on the written data voltage Vdata to the light-emitting circuit 40 in response to a light-emitting control signal on the light-emitting control line EM[n] to drive the light-emitting circuit 40 to emit light.

Specifically, S[2n]=1, S[2n+1]=1, S[2n−1]=1 and EM[n] =0. The sixth transistor T6 and the seventh transistor T7 are turned on. The gate-source voltage Vgs of the fifth transistor T5 (the driving transistor) is Vgs=Vg−Vs=Vdata+Vth−VDD. The fifth transistor T5 operates in a saturated state and generates a driving current I as follows:

$$\begin{aligned} I &= K(Vgs - Vth)^2 \\ &= K(Vdata + Vth - VDD - Vth)^2 \\ &= K(Vdata - VDD)^2 \end{aligned} \tag{1}$$

where K is a parameter related to the fifth transistor T5, which can be regarded as a constant.

It can be seen from equation (1) that the current I for driving the organic light-emitting diode L to emit light is independent of the threshold voltage Vth of the fifth transistor T5, thereby eliminating the influence of the threshold voltage Vth of the driving transistor (i.e., the fifth transistor T5) on the luminance of the organic light-emitting diode L, and hence increasing the luminance uniformity of the display.

Figure 6:
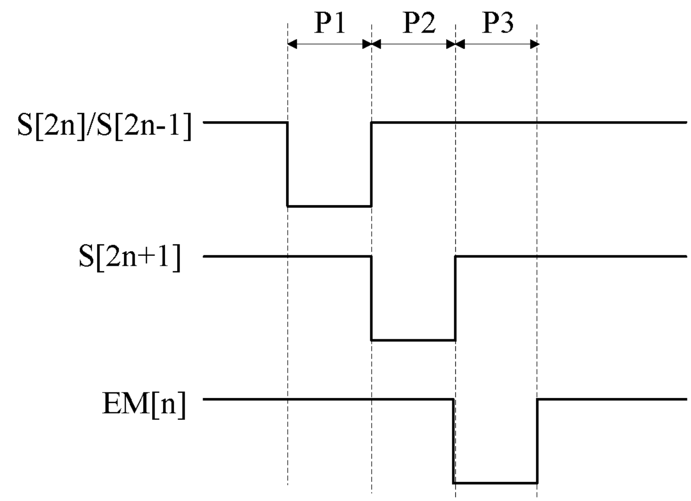
FIG. 6 schematically illustrates a timing diagram for the pixel circuit of FIG. 3.

The operations of the pixel circuit of FIG. 4 have been described above with reference to FIG. 5. FIG. 6 schematically illustrates a timing diagram for the pixel circuit of FIG. 3. As shown in FIG. 6, since the first scan line S[2n] and the third scan line S[2n−1] transmit the same signal, the initialization phase P1 does not need to be subdivided into the first sub-phase P11 and the second sub-phase P12.

It will be understood that the first scan line S[2n] and the third scan line S[2n−1] may also be configured to transmit the same signal for the pixel circuit of FIG. 4, and thus the timing diagram of FIG. 6 also applies to the pixel circuit of FIG. 4. In addition, in the above description, the individual transistors are described as P-type transistors. In the case of N-type transistors, the control signal shown in FIG. 5 or 6 needs to be reversed to drive corresponding transistors.

Figure 7:
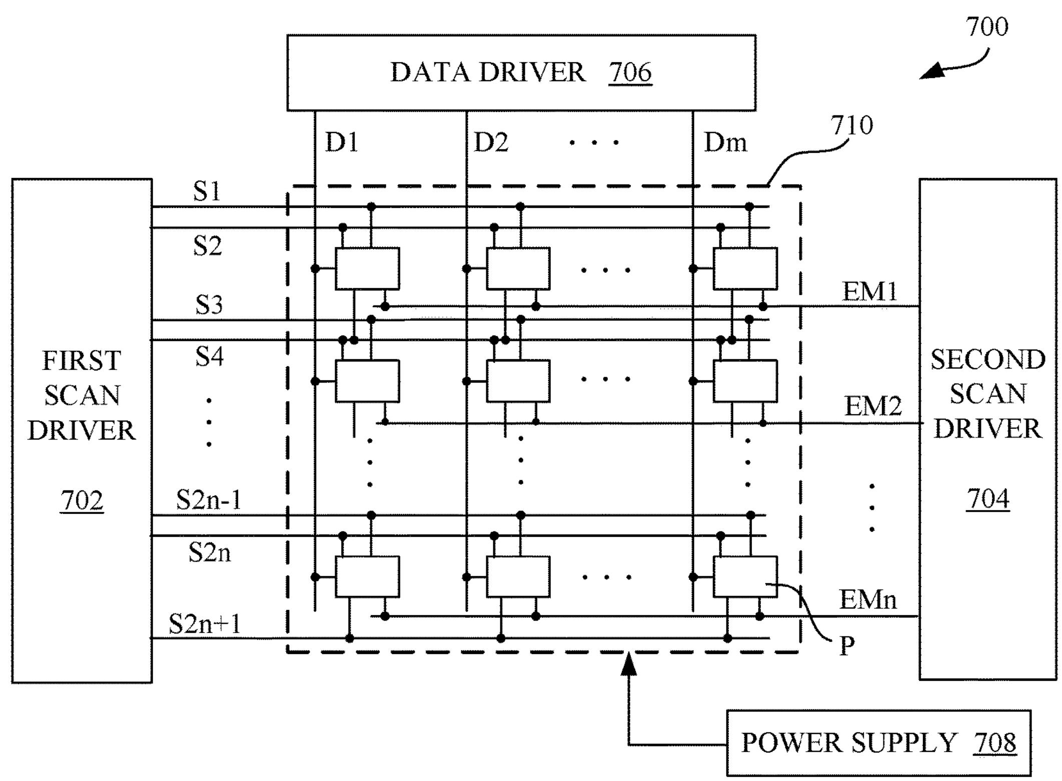
FIG. 7 schematically illustrates a block diagram of a display apparatus according to an embodiment of the present disclosure.

FIG. 7 schematically illustrates a block diagram of a display apparatus 700 according to an embodiment of the present disclosure. Referring to FIG. 7, the display apparatus 700 includes a display panel 710, a first scan driver 702, a second scan driver 704, a data driver 706, and a power supply 708.

The display panel 710 includes a pixel array including n×m pixel circuits P. Each of the pixel circuits P includes an OLED. The display panel 710 includes 2n+1 scan lines S1, S2, . . . , S2n, S2n+1 arranged in a first direction (row direction in the figure) to transmit scan signals; m data lines D1, D2, . . . , Dm arranged in a second direction (column direction in the figure) to transmit data signals, n light emission control lines EM1, EM2, . . . , EMn arranged in the first direction to transmit light-emitting control signals; and m first electric wires (not shown) and m second electric wires (not shown) for applying the first and second voltages VDD and VSS. n and m are natural numbers.

The first scan driver 702 is connected to the scan lines S1, S2, S2n, . . . , S2n+1 to apply scan signals to the display panel 710.

The second scan driver 704 is connected to the light emission control lines EM1, EM2, EMn, . . . , EMn+1 to apply light-emitting control signals to the display panel 710.

The data driver 706 is connected to the data lines D1, D2, . . . , Dm to apply data signals to the display panel 710. Here, the data driver 706 supplies the data signals to the pixel circuits P of the display panel 710 during the data write phase.

The power supply 708 applies the first voltage VSS and the second voltage VDD to each of the pixel circuits P in the display panel 710.

The display apparatus 700 may be any product or component that has a display function, such as a cell phone, a tablet, a television, a monitor, a notebook computer, a digital photo frame, a navigator and the like.

Various modifications and alternations of the foregoing exemplary embodiments of the present disclosure will be readily apparent to those skilled in the relevant arts in view of the foregoing description in conjunction with reading the accompanying drawings. Any and all modifications will still fall within the scope of the non-limiting and exemplary embodiments of this disclosure. Furthermore, other embodiments of the disclosure described herein will come to mind to one skilled in the art to which these embodiments pertain having the benefit of the teachings presented in the foregoing descriptions and the associated drawings.

What is claimed is:

1. A pixel circuit, comprising a light-emitting circuit, a driving circuit, a compensation circuit, and an initialization circuit, wherein:

the initialization circuit is connected to a first voltage terminal, a first scan line, and a third scan line and is configured to initialize the driving circuit and the light-emitting circuit with a first voltage supplied from the first voltage terminal in response to a first scan signal on the first scan line and a third scan signal on the third scan line;

the compensation circuit is connected to a second scan line, a data line and a second voltage terminal and is configured to, responsive to a second scan signal on the second scan line, write a data voltage on the data line into the driving circuit and perform threshold voltage compensation on the driving circuit;

the driving circuit is connected to the second voltage terminal and a light emission control line and is configured to generate a current dependent on the written data voltage in response to a light emission control signal on the light emission control line; and the light-emitting circuit is connected between the driving circuit and the first voltage terminal and is configured to be driven to emit light by the current, wherein the initialization circuit comprises:

a first transistor having a gate connected to the first scan line, a first electrode connected to the first voltage terminal, and a second electrode connected to a first node connected between the driving circuit and the light-emitting circuit; and a second transistor having a gate connected to the third scan line, a first electrode connected to the first voltage terminal, and a second electrode connected to a second node connected to the driving circuit, and wherein the second transistor and the first transistor are configured to be turned on sequentially in response to the third scan signal and the first scan signal respectively, so as to sequentially initialize the driving circuit and the light-emitting circuit.

2. The pixel circuit of claim 1, wherein the driving circuit comprises:

a fifth transistor having a source, a drain, and a gate, the gate being connected to the second node;

a sixth transistor having a gate connected to the light emission control line, a first electrode connected to the second voltage terminal, and a second electrode connected to the source of the fifth transistor; and a seventh transistor having a gate connected to the light emission control line, a first electrode connected to the drain of the fifth transistor, and a second electrode connected to the first node.

3. The pixel circuit of claim 2, wherein the compensation circuit comprises:

a third transistor having a gate connected to the second scan line, a first electrode connected to the drain of the fifth transistor, and a second electrode connected to the second node;

a fourth transistor having a gate connected to the second scan line, a first electrode connected to the data line, and a second electrode connected to the source of the fifth transistor; and a capacitor having a first terminal connected to the second voltage terminal and a second terminal connected to the second node.

4. The pixel circuit of claim 2, wherein the light-emitting circuit comprises an organic light-emitting diode having a first terminal connected to the first node and a second terminal connected to the first voltage terminal.

5. The pixel circuit of claim 4, wherein the fifth transistor is a P-type transistor, wherein the first terminal of the organic light-emitting diode is an anode, and wherein the second terminal of the organic light-emitting diode is a cathode.

6. The pixel circuit of claim 4, wherein the fifth transistor is an N-type transistor, wherein the first terminal of the organic light-emitting diode is a cathode, and wherein the second terminal of the organic light-emitting diode is an anode.

7. A display panel comprising:

a plurality of scan lines arranged in a first direction;

a plurality of light emission control lines arranged in the first direction;

a plurality of data lines arranged in a second direction intersecting the first direction; and a pixel array comprising a plurality of pixel circuits arranged at intersections of the scanning lines, the light emission control lines and the data lines, each of the pixel circuits being connected to three respective ones of the scanning lines and a respective one of the light emission control lines and comprising a light-emitting circuit, a driving circuit, a compensation circuit, and an initialization circuit, wherein:

the initialization circuit is connected to a first voltage terminal and first and third ones of the three respective scan lines and is configured to initialize the driving circuit and the light-emitting circuit with a first voltage supplied from the first voltage terminal in response to a first scan signal on the first scan line and a third scan signal on the third scan line;

the compensation circuit is connected to a second one of the three respective scan lines, a data line and a second voltage terminal and is configured to, responsive to a second scan signal on the second scan line, write a data voltage on the data line into the driving circuit and perform threshold voltage compensation on the driving circuit;

the driving circuit is connected to the second voltage terminal and the respective light emission control line and is configured to generate, responsive to a light-emitting control signal on the respective light emission control line, a current dependent on the written data voltage; and the light-emitting circuit is connected between the driving circuit and the first voltage terminal and is configured to be driven to emit light by the current, wherein the initialization circuit comprises:

a first transistor having a gate connected to the first scan line, a first electrode connected to the first voltage terminal, and a second electrode connected to a first node connected between the driving circuit and the light-emitting circuit; and a second transistor having a gate connected to the third scan line, a first electrode connected to the first voltage terminal, and a second electrode connected to a second node connected to the driving circuit, and wherein the second transistor and the first transistor are configured to be turned on sequentially in response to the third scan signal and the first scan signal respectively, so as to sequentially initialize the driving circuit and the light-emitting circuit.

8. The display panel of claim 7, wherein the driving circuit comprises:

a fifth transistor having a source, a drain, and a gate connected to the second node;

a sixth transistor having a gate connected to the respective light emission control line, a first electrode connected to the second voltage terminal, and a second electrode connected to the source of the fifth transistor; and a seventh transistor having a gate connected to the respective light emission control line, a first electrode connected to the drain of the fifth transistor, and a second electrode connected to the first node.

9. The display panel of claim 8, wherein the compensation circuit comprises:

a third transistor having a gate connected to the second scan line, a first electrode connected to the drain of the fifth transistor, and a second electrode connected to the second node;

a fourth transistor having a gate connected to the second scan line, a first electrode connected to the data line, and a second electrode connected to the source of the fifth transistor; and a capacitor having a first terminal connected to the second voltage terminal and a second terminal connected to the second node.

10. The display panel of claim 8, wherein the light-emitting circuit comprises an organic light-emitting diode having a first terminal connected to the first node and a second terminal connected to the first voltage terminal.

11. The display panel of claim 10, wherein the fifth transistor is a P-type transistor, wherein the first terminal of the organic light-emitting diode is an anode, and wherein the second terminal of the organic light-emitting diode is a cathode.

12. The display panel of claim 10, wherein the fifth transistor is an N-type transistor, wherein the first terminal of the organic light-emitting diode is a cathode, and wherein the second terminal of the organic light-emitting diode is an anode.

13. A display apparatus comprising the display panel as claimed in claim 7.

14. A method of driving a pixel circuit, the pixel circuit comprising an initialization circuit connected to a first voltage terminal, a first scan line, and a third scan line, a compensation circuit connected to a second scan line, a data line, and a second voltage terminal, a driving circuit connected to the second voltage terminal and a light emission control line, and a light-emitting circuit connected between the driving circuit and the first voltage terminal, wherein the initialization circuit comprises: a first transistor having a gate connected to the first scan line, a first electrode connected to the first voltage terminal, and a second electrode connected to a first node connected between the driving circuit and the light-emitting circuit; and a second transistor having a gate connected to the third scan line, a first electrode connected to the first voltage terminal, and a second electrode connected to a second node connected to the driving circuit, and the method comprising:

initializing, by the initialization circuit, the driving circuit and the light-emitting circuit with a first voltage supplied from the first voltage terminal in response to a first scan signal on the first scan line and a third scan signal on the third scan line;

writing, by the compensation circuit in response to a second scan signal on the second scan line, a data voltage on the data line into the driving circuit and performing threshold voltage compensation on the driving circuit; and supplying, by the driving circuit in response to a light-emitting control signal on the light emission control line, a current dependent on the written data voltage to drive the light-emitting circuit to emit light, wherein the initializing the driving circuit and the light-emitting circuit comprises sequentially turning on the second transistor and the first transistor in response to the third scan signal and the first scan signal respectively, so as to sequentially initialize the driving circuit and the light-emitting circuit.

15. The method of claim 14, wherein the compensation circuit comprises a third transistor, a fourth transistor, and a capacitor, wherein the driving circuit comprises a fifth transistor, a sixth transistor, and a seventh transistor, wherein the light-emitting circuit comprises an organic light-emitting diode, and wherein:

the initializing the driving circuit and the light-emitting circuit further comprises applying the first voltage to a gate of the fifth transistor and both ends of the light-emitting diode through the first and second transistors, respectively;

the writing the data voltage into the driving circuit and performing the threshold voltage compensation on the driving circuit comprises writing the data voltage and a threshold voltage of the fifth transistor into a gate of the fifth transistor through the fourth, fifth, and third transistors; and the supplying the current to the light-emitting circuit comprises providing a current path through which the current flows, the current path comprising the sixth, fifth and seventh transistors and the organic light-emitting diode connected in series.

16. The method of claim 15, wherein the applying the first voltage to the gate of the fifth transistor and the both ends of the organic light-emitting diode through the first and second transistors respectively comprises turning on the first and second transistors during two consecutive periods of time respectively.

* * * * *